US010586921B2

(12) United States Patent
Annunziata et al.

(10) Patent No.: US 10,586,921 B2
(45) Date of Patent: *Mar. 10, 2020

(54) FORMING SELF-ALIGNED CONTACTS ON PILLAR STRUCTURES

(71) Applicant: International Business Machines Corporation, Armonk, NY (US)

(72) Inventors: Anthony J. Annunziata, Stamford, CT (US); Daniel C. Edelstein, White Plains, NY (US); Eugene J. O'Sullivan, Nyack, NY (US); Henry K. Utomo, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/021,214

(22) Filed: Jun. 28, 2018

(65) Prior Publication Data

US 2018/0308898 A1 Oct. 25, 2018

Related U.S. Application Data

(63) Continuation of application No. 15/453,432, filed on Mar. 8, 2017, now Pat. No. 10,109,675.

(51) Int. Cl.
*H01L 29/82* (2006.01)
*H01L 43/12* (2006.01)
*H01L 43/08* (2006.01)
*H01L 27/22* (2006.01)
*H01L 45/00* (2006.01)

(52) U.S. Cl.
CPC ............ *H01L 43/12* (2013.01); *H01L 27/228* (2013.01); *H01L 43/08* (2013.01); *H01L 45/06* (2013.01)

(58) Field of Classification Search
CPC ......... H01L 43/08; H01L 43/02; H01L 43/12; H01L 27/222
USPC ........................................... 257/421
See application file for complete search history.

(56) References Cited

U.S. PATENT DOCUMENTS

| 8,008,095 B2 | 8/2011 | Assefa et al. |
| 8,575,584 B2 | 11/2013 | Satoh et al. |
| 8,796,041 B2 | 8/2014 | Assefa et al. |

(Continued)

FOREIGN PATENT DOCUMENTS

| IN | 7946CHENP2012 A | 12/2015 |
| JP | H104227 A | 1/1998 |
| JP | H10162326 A | 6/1998 |

OTHER PUBLICATIONS

English translation for India Application No. IN7946CHENP2012A.
List of IBM Patents or Patent Applications Treated as Related.

*Primary Examiner* — Theresa T Doan
(74) *Attorney, Agent, or Firm* — Vazken Alexanian; Ryan, Mason & Lewis, LLP (57) ABSTRACT

A method of forming a semiconductor structure includes forming two or more pillar structures over a top surface of a substrate. The method also includes forming two or more contacts to the two or more pillar structures. The method further includes forming an insulator between the two or more pillar structures and the two or more contacts. The two or more contacts are self-aligned to the two or more pillar structures by forming the insulator via conformal deposition and etching the insulator selective to a spin-on material formed over the insulator between the two or more pillar structures.

19 Claims, 5 Drawing Sheets

(56) References Cited

U.S. PATENT DOCUMENTS

| | | | |
|---|---|---|---|
| 8,847,338 B2 | 9/2014 | Assefa et al. | |
| 8,884,387 B2 | 11/2014 | Assefa et al. | |
| 8,980,649 B2 | 3/2015 | Ranjan et al. | |
| 9,117,747 B2 | 8/2015 | Masuoka et al. | |
| 9,190,260 B1 | 11/2015 | Zhang et al. | |
| 9,343,659 B1 | 5/2016 | Lu et al. | |
| 9,354,519 B2 | 5/2016 | Ban et al. | |
| 9,385,308 B2 | 7/2016 | Li | |
| 10,109,675 B2* | 10/2018 | Annunziata | H01L 43/08 |
| 2009/0261408 A1 | 10/2009 | Fujimoto | |
| 2010/0124813 A1 | 5/2010 | Matamis et al. | |
| 2011/0266615 A1* | 11/2011 | Oyu | H01L 21/823412 |
| | | | 257/329 |
| 2016/0020249 A1* | 1/2016 | Ko | H01L 27/228 |
| | | | 257/427 |
| 2016/0077435 A1* | 3/2016 | Ban | G03F 7/11 |
| | | | 430/315 |
| 2016/0079307 A1 | 3/2016 | Lu | |
| 2016/0133828 A1* | 5/2016 | Lu | H01L 43/02 |
| | | | 257/421 |
| 2016/0141489 A1* | 5/2016 | Zhang | H01L 43/02 |
| | | | 257/421 |

\* cited by examiner

FORMING SELF-ALIGNED CONTACTS ON PILLAR STRUCTURES

BACKGROUND

The present application relates to semiconductors, and more specifically, to techniques for forming semiconductor structures. Magnetoresistive random access memory (MRAM) is a non-volatile computer memory (NVRAM) technology. In some conventional random access memory (RAM) devices, data is stored as electric charge or current flows. MRAM, in contrast, stores data using magnetic storage elements. Such elements may be formed using two ferromagnetic plates separated by a thin insulating later. One plate is a permanent magnet set to a particular polarity, with the other plate having a field that can be changed to match that of an external field to store data. This configuration is known as a spin valve and forms the structure for an MRAM bit or cell. An MRAM device may contain a grid of such structures or cells.

SUMMARY

Embodiments of the invention provide techniques for forming self-aligned contacts on pillar structures.

For example, in one embodiment a method of forming a semiconductor structure comprises forming two or more pillar structures over a top surface of a substrate, forming two or more contacts to the two or more pillar structures, and forming an insulator between the two or more pillar structures and the two or more contacts, wherein the two or more contacts are self-aligned to the two or more pillar structures by forming the insulator via conformal deposition and etching the insulator selective to a spin-on material formed over the insulator between the two or more pillar structures.

In another embodiment, a semiconductor structure comprises two or more pillar structures disposed over a top surface of a substrate, two or more contacts to the two or more pillar structures, and an insulator disposed between the two or more pillar structures and the two or more contacts, wherein the two or more contacts are self-aligned to the two or more pillar structures.

In another embodiment, an integrated circuit comprises a semiconductor structure comprising two or more pillar structures disposed over a top surface of a substrate, two or more contacts to the two or more pillar structures, and an insulator disposed between the two or more pillar structures and the two or more contacts, wherein the two or more contacts are self-aligned to the two or more pillar structures.

DETAILED DESCRIPTION

Illustrative embodiments of the invention may be described herein in the context of illustrative methods for forming self-aligned contacts on pillar structures, along with illustrative apparatus, systems and devices having self-aligned contacts formed using such methods. However, it is to be understood that embodiments of the invention are not limited to the illustrative methods, apparatus, systems and devices but instead are more broadly applicable to other suitable methods, apparatus, systems and devices.

MRAM devices, as described above, may include a grid or other arrangement of multiple cells. Spin transfer torque MRAM (STT-MRAM) is a type of MRAM device in which the spin of electrons can be flipped using a spin-polarized current in a magnetic tunnel junction (MTJ). STT-MRAM can provide a number of advantages, including reduced power consumption and cost. Particularly, STT-MRAM provides advantages in scaling permitting higher densities of MRAM cells at a lower cost. MTJs in MRAM devices generally comprise of an insulating layer (e.g., the tunnel junction) formed between two or more ferromagnetic layers.

Surface topography can impact lithography due to misalignment. To account for this, some semiconductor devices such as embedded MRAM (eMRAM) possibly using STT-MRAM technology design contacts to be larger than features underneath the contacts. In STT-MRAM, for example, pillars may have a diameter of approximately 35 nanometers (nm). Contacts above such pillars, however, may be made two to three times larger. Thus, improvements in density or smaller area for a device may be limited by contact dimensions.

There are various techniques which may be utilized to overcome the above issues regarding scaling. As one example, surface planarization may be utilized to reduce or eliminate surface topography before patterning. As another example, advanced patterning techniques and materials such as organic planarization layers (OPLs), silicon-containing anti-reflective coating (SiARC) layers, low temperature oxide (LTO) trilayers, etc. may be used. As a further example, interlayer dielectric (ILD) thickness may be increased before contact etching. This allows etching from further away, and due to ILD tapering during etching contacts can be made smaller as a result of the trench tapering.

Illustrative embodiments described herein utilize a spin-on material to cover and form puddles in crevices in a device. A protruding insulator can then be selectively etched to form contact trenches.

In a general process flow, pillars may be formed, followed by formation of an etch stop layer and insulator deposition. The etch stop layer may be a nitride and the insulator may be an oxide. The oxide may then be planarized, followed by lithography and insulator etching to form contact trenches. Metal may then be deposited in the contact trenches and chemical mechanical polishing (CMP) performed to form contacts. In some embodiments, oxide planarization and lithography steps may be replaced with the formation of spin-on materials such as photoresist or anti-reflective coating (ARC) as will be described in further detail below with respect to FIGS. 1-5.

Figure 1:
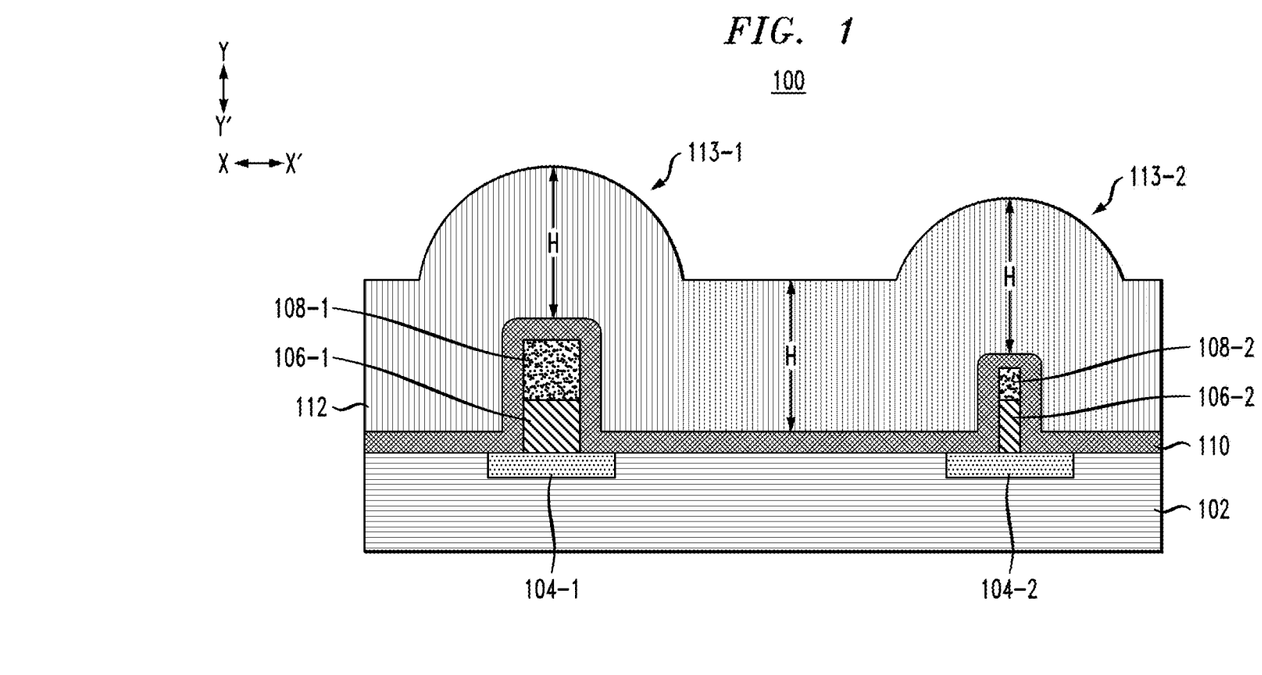
FIG. 1 depicts a side cross-sectional view of a structure with pillars formed therein, according to an embodiment of the present invention.

FIG. 1 depicts a side cross-sectional view 100 of a structure with pillar structures formed therein. In the above-described general process flow, the FIG. 1 structure is an example of the structure following formation of the etch stop layer and insulator. The FIG. 1 structure shows two pillar structures of varying size. It is to be appreciated, however, that this is not a requirement. In other embodiments, more or fewer than two pillar structures may be formed as desired. In addition, each pillar may have a same size, or more than two different sizes of pillars may be formed as desired.

The FIG. 1 structure includes an underlying structure 102, also referred to herein as a substrate. The underlying structure 102 will vary based on application. For example, if the FIG. 1 structure is used in fabricating MRAM such as STT-MRAM, the underlying structure 102 will be the supporting circuitry used to control and drive the MRAM. If the FIG. 1 structure is used in fabricating a metal-insulator-metal (MIM) capacitor, then the underlying structure 102 may be an insulator or semiconductor material. In some embodiments, the underlying structure 102 is formed of silicon (Si), although other suitable materials may be used based on the application. As discussed above, for MRAM applications the underlying structure 102 may provide supporting circuitry to control MRAM functionality while for MIM capacitor applications the underlying structure 102 may be a conductor material. The underlying structure 102 may have a vertical thickness (in the direction Y-Y') and a horizontal width (in the direction X-X') that varies as desired based on the application, the number of pillar structures and the spacing between the pillar structures.

FIG. 1 shows layers 104-1 and 104-2 formed beneath each of the pillar structures in the underlying structure 102. The layers 104-1 and 104-2 may be formed of a conductor material, and depending on the application may provide bottom contacts or electrodes for a resulting structure. The layers 104-1 and 104-2 may be formed of copper (Cu), although other suitable materials including but not limited to other conducting materials and alloys may be used. If the resulting structure is MRAM or a microelectromechanical system (MEMS), for example, the layers 104-1 and 104-2 may comprise a conducting alloy. Each of the layers 104-1 and 104-2 may have a vertical thickness in the direction Y-Y' ranging as desired for a particular application. Since the layers 104-1 and 104-2 are conductors, their thickness may be determined by the resistance criteria required for a particular application. Depending on the criteria and conductor material, the thickness will vary. If, for example, 100 ohm ($\Omega$) is the criteria and the conducting material is Cu, then the thickness of the layers 104-1 and 104-2 would generally be thinner (for the same width and length) than if the conducting material were aluminum (Al). Each of the layers 104-1 and 104-2 may have a horizontal width in the direction X-X' that again may vary based on the application. For example, if the use case is MRAM then certain technology guidelines may govern the size of the layers 104-1 and 104-2 (e.g., the horizontal width of the layers 104-1 and 1042-2 for 90 nm technology may have a different size compared to 28 nm technology). Although FIG. 1 shows an example wherein layers 104-1 and 104-2 are the same size, this is not a requirement. For example, the horizontal widths of the layers 104-1 and 104-2 may vary based on the size of the pillar structures which are formed.

Pillars 106-1 and 106-2 are formed as shown, with capping layers 108-1 and 108-2 formed over the pillars 106-1 and 106-2, respectively. The pillar 106-1 and capping layer 108-1 may form a first pillar structure, while the pillar 106-2 and capping layer 108-2 form a second pillar structure. The capping layers 108-1 and 108-2 may also be referred to as hard masks, as they may be used for patterning purposes in some applications.

The pillars 106-1 and 106-2 are collectively referred to herein as pillars 106, and the capping layers 108-1 and 108-2 are collectively referred to herein as capping layers 108. The pillars 106 may be formed of various materials depending on the application. For MRAM applications, the pillars 106 may be formed of magnetic materials separated by an insulator. For MIM capacitor applications, the pillars 106 may be formed of insulators with a high K value. For resistive memory (ReRAM), the pillars 106 may be formed of phase change materials.

The capping layers 108 may be formed of tantalum nitride (TaN), although other suitable materials including but not limited to titanium nitride (TiN) and tungsten (W) may be used. More generally, the capping layers 108 are formed of a conductor material that is stable during downstream processes. TaN, for example, may be used to get selectivity during patterning of the pillars 106 and to provide a good transition conductor between the pillars 106 and top contacts or electrodes formed to connect to the pillars 106. Thus, it is to be appreciated that various other materials may be used for the capping layers 108 depending on the application.

In some embodiments, the pillars 106 may form the MTJs for an MRAM device. In such embodiments, the pillars 106 may be formed from an insulator sandwiched between two ferromagnetic layers as discussed above. Example ferromagnetic materials which may be used include a cobalt-nickel (Co—Ni) alloy, a cobalt-iron-boron (Co—Fe—B) alloy or another suitable material including but not limited to other cobalt (Co) or nickel (Ni) alloys. More generally, materials with high magnetic properties may be utilized in some embodiments. The insulator formed between the ferromagnetic layers may be magnesium oxide (MgO), although other suitable materials may be used. The insulator, more generally, may be formed of an oxide material which may be deposited thinly and uniformly, such that the oxide provides high barrier energy so that electrons cannot jump over but may tunnel through.

The pillars 106 may vary in size as desired. For example, the larger pillar 106-1 may have a vertical thickness in direction Y-Y' ranging from 10 nm to 200 nm and a horizontal width in direction X-X' ranging from 10 nm to 100 nm. The smaller pillar 106-2 may have a vertical thickness in direction Y-Y' ranging from 10 nm to 200 nm and a horizontal width in direction X-X' ranging from 10 nm to 100 nm. The capping layers 108 may similarly vary in size. The horizontal width in direction X-X' of each of the pillars 108 may match that of its underlying pillar 106. The vertical thickness in direction Y-Y' of the capping layers 108, however, may vary as desired. For the larger pillar 106-1, the capping layer 108-1 may have a vertical thickness in direction Y-Y' ranging from 10 nm to 100 nm. For the smaller pillar 106-2, the capping layer 108-2 may have a vertical thickness in direction Y-Y' ranging from 10 nm to 100 nm.

Etch stop layer 110 is formed over the top of the substrate 102 and surrounding the pillars 106 and capping layers 108. The etch stop layer 110 may be formed of a nitride material, although other suitable materials including but not limited to insulator materials such as silicon oxide (SiO), silicon oxynitride (SiON), silicon oxycarbonitride (SiOCN), etc. that can be deposited below a required thermal budget may be used. If the pillars 106 are formed during back end of line (BEOL) processing, then the deposition typically needs to be done at 400 degrees Celsius (° C.) or lower. If the pillars are formed during front end of line (FEOL) processing, then the deposition can be done at 700° C. or lower. The vertical thickness in direction Y-Y' of the etch stop layer 110 may range from 10 nm to 50 nm.

Insulator 112 is formed over the etch stop layer 110. The insulator 112 may be an oxide, although other suitable materials may be used, such as materials having a different etch rate than the etch stop layer 110 in the etch process used to create contact trenches described below with respect to FIG. 3. The insulator 112 may be formed with a substantially uniform vertical thickness in direction Y-Y' that is larger than the vertical thickness of the pillars 106 and the capping layers 108 combined. This substantially uniform thickness is represented by the height H labeled as shown in FIG. 1. In some embodiments H is at least 50 nm taller or thicker (in direction Y-Y') than the pillars 106 and the capping layers 108. As illustrated, the thickness of the insulator 112 above each of the pillars 106 is the same as the thickness of the insulator 112 between the pillars 106. Thus, the insulator 112 forms "bumps" and "valleys" as shown. The bump above pillar 106-1 is labeled 113-1, while the bump above pillar 106-2 is labeled 113-2. The bumps 113-1 and 113-2 are collectively referred to herein as bumps 113. The insulator 112 may be formed using a conformal oxide deposition to create the bumps 113 and the valleys between the bumps 113, which simplifies etching processes discussed below.

Figure 2:
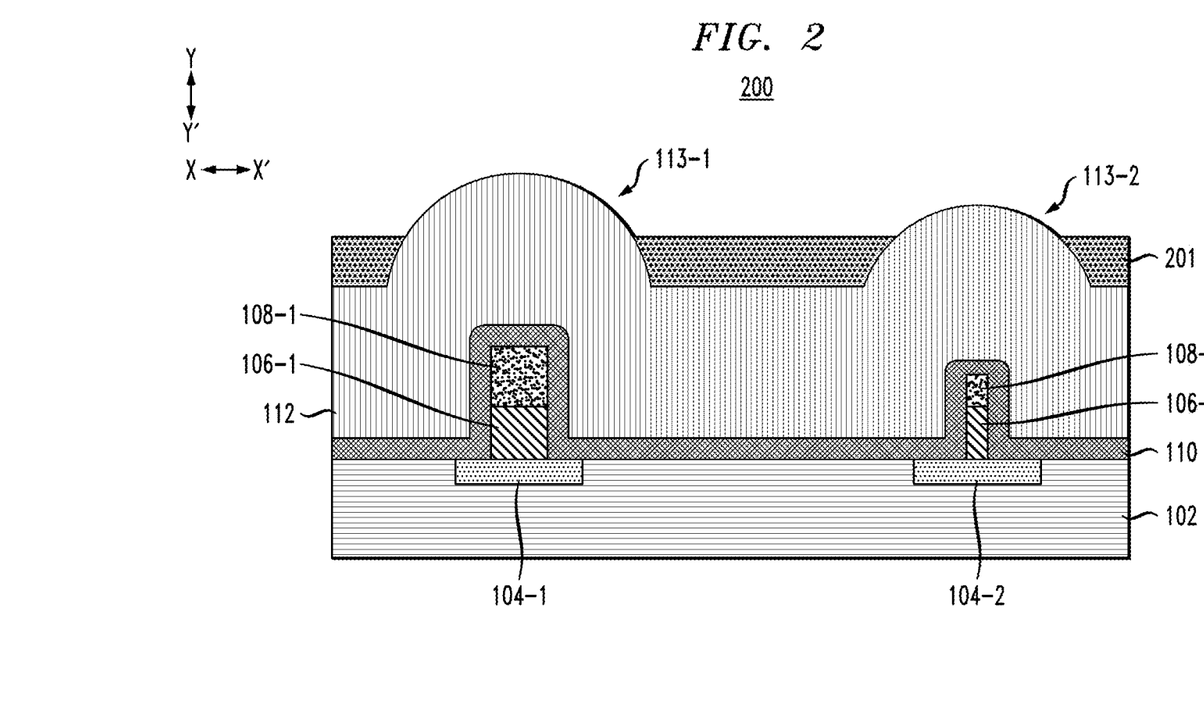
FIG. 2 depicts a side cross-sectional view of the FIG. 1 structure following spin-on of an additional material, according to an embodiment of the present invention.

FIG. 2 depicts a side cross-sectional view 200 of the FIG. 1 structure following spin-on of an additional material 201. The spin-on material 201 has a different etch rate than the insulator 112. The spin-on material 201 may be an OPL, a flowable oxide or another suitable material including but not limited to spin-on dielectrics having a different etch rate than the insulator 112. FIG. 2 illustrates puddling of the spin-on material 202 between or surrounding the bumps 113.

Figure 3:
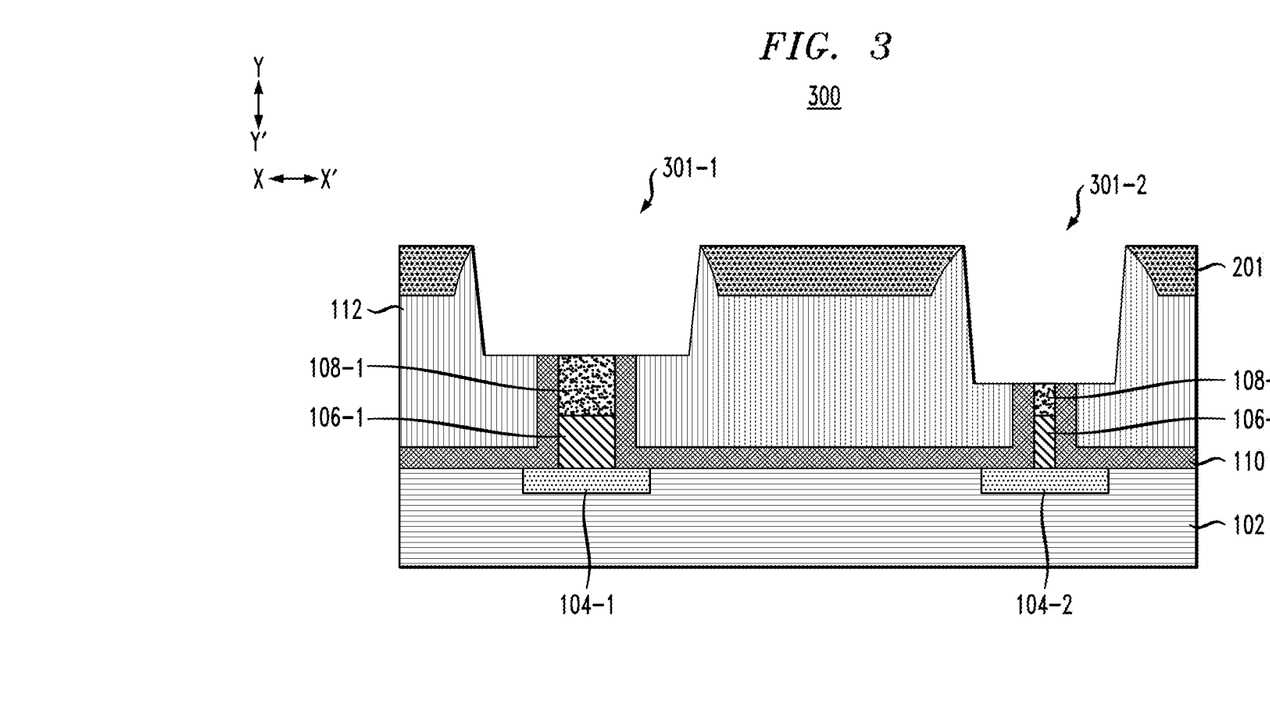
FIG. 3 depicts a side cross-sectional view of the FIG. 2 structure following an etch process, according to an embodiment of the present invention.

FIG. 3 depicts a side cross-sectional view 300 of the FIG. 2 structure following etching to form contact trenches 301-1 and 301-2 collectively referred to herein as contact trenches 301. The insulator 112 may be etched using reactive-ion etching (RIE), although other suitable etching processes including anisotropic dry etches selective to spin-on material 201 may be used in other embodiments. Following the etching, contact trench 301-1 is formed over pillar 106-1 and contact trench 301-2 is formed over pillar 106-2. The forming of the spin-on material 201 described with respect to FIG. 2 allows for avoiding a lithography step since the contact trenches 301 are self-align to the bumps 113 as a result of the differing etch rates between the insulator 112 and the spin-on material 201.

Figure 4:
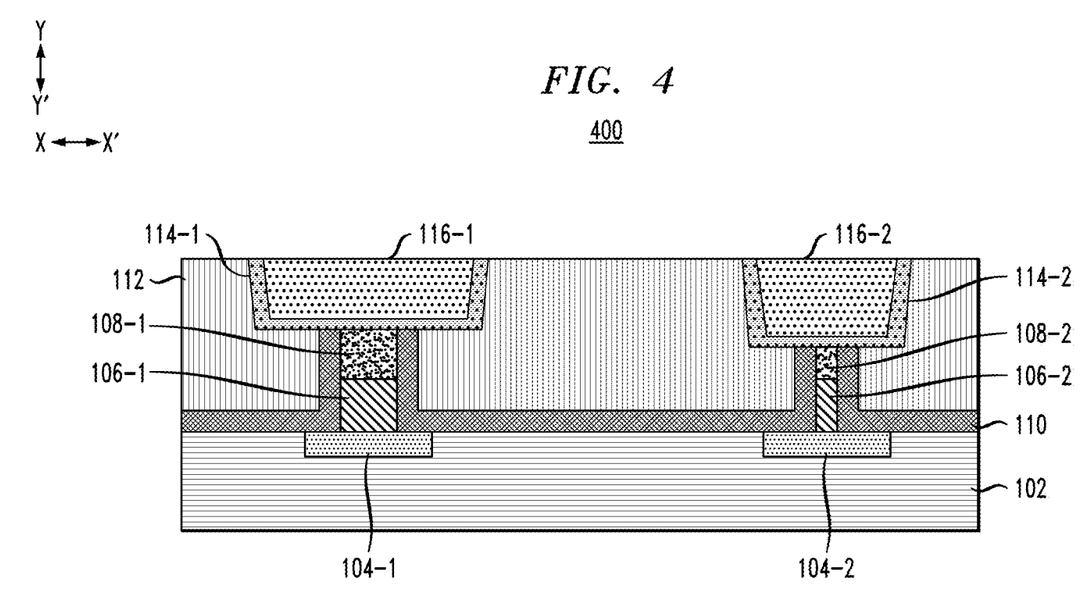
FIG. 4 depicts a side cross-sectional view of the FIG. 3 structure following deposition of contacts and planarization, according to an embodiment of the present invention.

FIG. 4 depicts a side cross-sectional view 400 of the FIG. 3 structure following deposition of contacts and planarization. As shown, liners 114-1 and 114-2 are formed in the trenches 301-1 and 301-2, respectively. The liners 114-1 and 114-2 are collectively referred to herein as liners 114. Liners 114 may be formed of TaN, Co or another suitable material that follows the BEOL technology may be used. Liners 114 may have a thickness ranging from 0 to 300 nm depending on the BEOL technology that is used.

Top contacts 116-1 and 116-2 are formed over the liners 114 in the trenches 301-1 and 301-2, respectively. Top contacts 116-1 and 116-2 are collectively referred to herein as top contacts 116. The top contacts 116 may also be referred to as top electrodes, as distinguished from the bottom contacts or electrodes provided by layers 104-1 and 104-2. The top contacts 116 may be formed of Cu, although other suitable materials including but not limited to Al, W or another material specified by BEOL guidelines may be used. In some embodiments, the material used for the pillars 106, capping layers 108, liners 114 and top contacts 116 may vary between pillars. For example, the material of the top contact 116-1 may differ from the material of the top contact 116-2. The top contacts 116 may have a vertical thickness in direction Y-Y' which varies based on the BEOL or FEOL guidelines. It is to be appreciated that due to the varying heights of the pillars 106 and capping layers 108, the top contacts 116-1 and 116-2 may have different vertical thicknesses. After the liners 114 are formed and the material of the top contacts 116 are deposited in the trenches 301, CMP may be used to planarize the top surface of the FIG. 4 structure.

Figure 5:
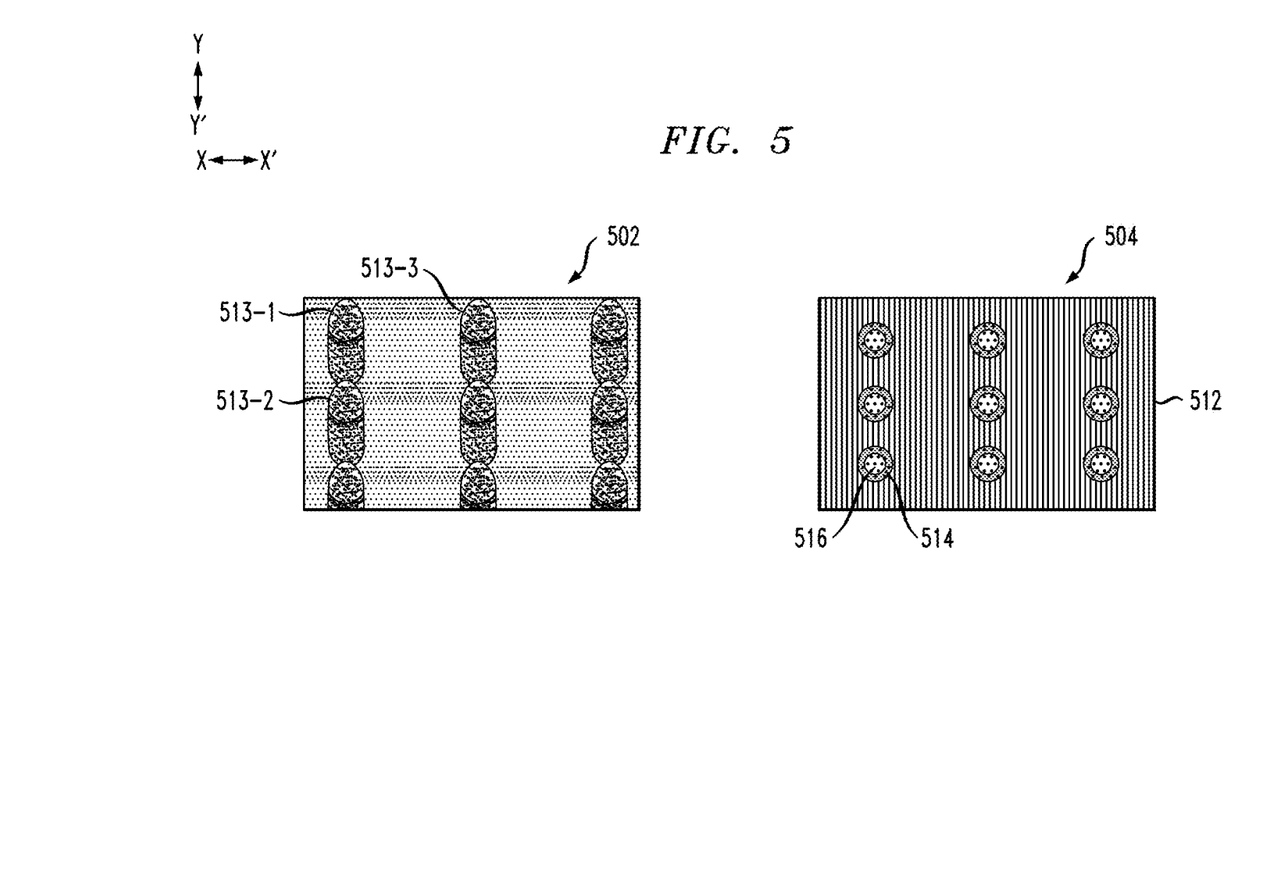
FIG. 5 depicts an isometric view of a structure with pillars formed therein and a top-down view of the structure fol-lowing formation of contacts and planarization, according to an embodiment of the present invention.

FIG. 5 depicts an isometric view 502 of a structure with pillars formed therein and a top-down view 504 of the structure following formation of the top contacts and planarization.

The isometric view 502 shows nine discrete "islands" formed above pillars. For clarity, only three of the islands 513-1, 513-2 and 513-3 are labeled. The isometric view 502 corresponds generally to the side cross-sectional view 100 shown in FIG. 1, although the number and sizing of the pillars is changed. Whereas FIG. 1 showed a structure with two differently-sized pillars in the direction X-X', isometric view shows three rows each having three pillars of the same size.

The isometric view 502, similar to the side cross-sectional view 100, shows the pillars covered by insulator material. Although in the isometric view 502 each of the islands are discrete, this is not a requirement. In other embodiments, two or more of the islands may be connected. For example, islands in one or more of the "columns" in direction Y-Y', such as islands 513-1 and 513-2, may be connected to one another. As another example, islands in one or more of the "rows" in direction X-X', such as islands 513-1 and 513-3, may be connected to one another. Various other arrangements are possible, including arrangements in which islands in multiple rows and/or columns are connected.

The top-down view 504 corresponds generally to the side cross-sectional view 400 in FIG. 4, although the number and sizing of pillars is changed as described above. Liners 514 are formed above each pillar, and top contacts 516 are formed above the liners 514. The liners 514 are surrounded by insulator 512. The sizing and material types for the insulator 512, liners 514 and top contacts 516 may be similar to those of the insulator 112, liners 114 and top contacts 116 described above.

As described above, one or more of the pillars shown and described with respect to FIGS. 1-5 may be used in MRAM or eMRAM devices, such as in the MTJs of STT-MRAM devices in some embodiments. In eMRAM applications, the eMRAM and self-aligned contacts are formed together using the process described above. To form contacts on the MRAM pillars, processes are altered from forming wires only to also making contacts to the pillars. The process described above with respect to FIGS. 1-5 separates pillar contacts without requiring additional lithography, giving flexibility to optimize eMRAM and contacts separately. For example, different metals, not strictly following back end of line (BEOL) standards such as Cu, may be used for contacts. Over or under etching to control the contacts around pillars can also be done without compromising wire processing. The formation of eMRAM with self-aligned contacts may take place between processing for an $M_{X-1}$ module and an $M_X$ module during BEOL processing, where the subscript for M denotes the number of layers or the level in BEOL processing. MRAM, for example, is typically inserted between two metal layers in BEOL processing.

While described above primarily with respect to eMRAM or MRAM devices, embodiments are not limited solely to use in forming eMRAM or MRAM devices. In some embodiments, one or more pillars may be used to form capacitors, such as MIM capacitors. In other embodiments, one or more of pillars may be used to form resistors, such as resistors for phase change memory or ReRAM. In some embodiments, different pillars on the same structure may be used to form combinations of the above or to form an integrated circuit which includes combinations of the above, such as a device with any combination of MIM capacitors, STT-MRAM devices, MRAM, phase change memory, ReRAM, etc.

In some embodiments, a method of forming a semiconductor structure comprises forming two or more pillar structures over a top surface of a substrate, forming two or more contacts to the two or more pillar structures, and forming an insulator between the two or more pillar structures and the two or more contacts. The two or more contacts are self-aligned to the two or more pillar structures by forming the insulator via conformal deposition and etching the insulator selective to a spin-on material formed over the insulator between or surrounding the two or more pillar structures.

The method may further include forming an etch stop layer over the two or more pillar structures and the top surface of the substrate, forming the insulator over the etch stop layer such that a top surface of portions of the insulator formed over tops of the two or more pillar structures are higher than the top surface of the insulator formed between the two or more pillar structures, forming the spin-on material over the top surface of the insulator between the two or more pillar structures, forming two or more contact trenches by etching the insulator and the etch stop layer formed over tops of the two or more pillar structures selective to the spin-on material, depositing contact material in the two or more contact trenches, and planarizing to remove the spin-on material. The insulator and the spin-on material may have different etch rates. The insulator may comprise an oxide and the spin-on material may comprise one of an OPL and a flowable oxide.

In some embodiments, a given one of the two or more pillar structures comprises a pillar and a capping layer formed over the pillar. The capping layer may comprise TaN. The pillar may comprise an MTJ stack for a MRAM cell in some embodiments. The MTJ stack may comprise an insulating layer formed between a first ferromagnetic layer and a second ferromagnetic layer. The insulating layer may comprise MgO and at least one of the first ferromagnetic layer and the second ferromagnetic layer comprises at least one of a Co—Ni alloy and a Co—Fe—B alloy. The pillar may comprise a MIM capacitor in other embodiments. The pillar may comprise a resistor of at least one of a phase change memory structure and a ReRAM structure in other embodiments.

The method may further include forming one or more metal layers in the substrate beneath at least a portion of at least one of the two or more pillar structures.

In some embodiments, forming the two or more contacts comprises depositing a liner material in two or more contact trenches formed in the insulator and depositing contact material over the liner material. The two or more contacts may comprise a first contact of a first material contacting a first one of the two or more pillar structures and a second contact of a second material different than the first material contacting a second one of the two or more pillar structures.

The two or more pillar structures may vary in size in some embodiments. For example, a first one of the two or more pillar structures may have a first height relative to the top surface of the substrate and a second one of the two or more pillar structures may have a second height different than the first height relative to the top surface of the substrate. As another example, a first one of the two or more pillar structures may have a first width in a direction parallel to the top surface of the substrate and a second one of the two or more pillar structures may have a second width in the direction parallel to the top surface of the substrate, the second width being different than the first width.

In some embodiments, a semiconductor structure comprises two or more pillar structures disposed over a top surface of a substrate, two or more contacts to the two or more pillar structures, and an insulator disposed between the two or more pillar structures and the two or more contacts. The two or more contacts are self-aligned to the two or more pillar structures by forming the insulator via conformal deposition and etching the insulator selective to a spin-on material formed over the insulator between two or more pillar structures. A given one of the two or more pillar structures may comprise a pillar and a capping layer disposed over the pillar, the pillar comprising an MTJ stack for an MRAM cell.

In some embodiments, an integrated circuit comprises a semiconductor structure comprising two or more pillar structures disposed over a top surface of a substrate, two or more contacts to the two or more pillar structures, and an insulator disposed between the two or more pillar structures and the two or more contacts. The two or more contacts are self-aligned to the two or more pillar structures by forming the insulator via conformal deposition and etching the insulator selective to a spin-on material formed over the insulator between two or more pillar structures. A given one of the two or more pillar structures may comprise a pillar and a capping layer disposed over the pillar, the pillar comprising an MTJ stack for an MRAM cell.

In the description above, various materials and dimensions for different elements are provided. Unless otherwise noted, such materials are given by way of example only and embodiments are not limited solely to the specific examples given. Similarly, unless otherwise noted, all dimensions are given by way of example and embodiments are not limited solely to the specific dimensions or ranges given.

Semiconductor devices and methods for forming same in accordance with the above-described techniques can be employed in various applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

In some embodiments, the above-described techniques are used in connection with semiconductor devices that may require or otherwise utilize, for example, complementary metal-oxide-semiconductors (CMOSs), metal-oxide-semiconductor field-effect transistors (MOSFETs), and/or fin field-effect transistors (FinFETs). By way of non-limiting example, the semiconductor devices can include, but are not limited to CMOS, MOSFET, and FinFET devices, and/or semiconductor devices that use CMOS, MOSFET, and/or FinFET technology.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a semiconductor structure, comprising:
    forming two or more pillar structures over a top surface of a substrate;
    forming two or more contacts to the two or more pillar structures; and
    forming an insulator between the two or more pillar structures and the two or more contacts;
    wherein the two or more contacts are self-aligned to the two or more pillar structures by forming the insulator via conformal deposition and etching the insulator selective to a spin-on material formed over the insulator between the two or more pillar structures;
    wherein the two or more contacts are of a different thickness; and
    wherein the two or more contacts comprise a first contact of a first material contacting a first one of the two or more pillar structures and a second contact of a second material different than the first material contacting a second one of the two or more pillar structures.

2. The method of claim 1, further comprising:
    forming an etch stop layer over the two or more pillar structures and the top surface of the substrate;
    forming the insulator over the etch stop layer such that a top surface of portions of the insulator formed over tops of the two or more pillar structures are higher than the top surface of the insulator formed between the two or more pillar structures;
    forming the spin-on material over the top surface of the insulator between the two or more pillar structures;
    forming two or more contact trenches by etching the insulator and the etch stop layer formed over tops of the two or more pillar structures selective to the spin-on material;
    depositing contact material in the two or more contact trenches; and
    planarizing to remove the spin-on material.

3. The method of claim 2, wherein a given one of the two or more pillar structures comprises a pillar and a capping layer formed over the pillar.

4. The method of claim 3, wherein the capping layer comprises tantalum nitride (TaN).

5. The method of claim 2, further comprising:
    forming a liner in the two or more contact trenches prior to depositing the contact material in the two or more contact trenches.

6. The method of claim 2, wherein the two or more contacts comprise Cu, Al, or W.

7. The method of claim 1, wherein the insulator and the spin-on material have different etch rates.

8. The method of claim 7, wherein the insulator comprises an oxide and the spin-on material comprises one of an organic planarization layer and a flowable oxide.

9. The method of claim 1, wherein a given one of the two or more pillar structures comprises a pillar and a capping layer formed over the pillar.

10. The method of claim 9, wherein the capping layer comprises tantalum nitride (TaN).

11. The method of claim 9, wherein the pillar comprises a magnetic tunnel junction (MTJ) stack for a magnetic random access memory (MRAM) cell.

12. The method of claim 11, wherein the MTJ stack comprises an insulating layer formed between a first ferromagnetic layer and a second ferromagnetic layer.

13. The method of claim 12, wherein the insulating layer comprises magnesium oxide (MgO) and at least one of the first ferromagnetic layer and the second ferromagnetic layer comprises at least one of a cobalt-nickel (Co—Ni) alloy and a cobalt-iron-boron (Co—Fe—B) alloy.

14. The method of claim 9, wherein the pillar comprises a metal-insulator-metal (MIM) capacitor.

15. The method of claim 9, wherein the pillar comprises a resistor of at least one of a phase change memory structure and a resistive random access memory (ReRAM) structure.

16. The method of claim 1, further comprising forming one or more metal layers in the substrate beneath at least a portion of at least one of the two or more pillar structures.

17. The method of claim 1, wherein forming the two or more contacts comprises depositing a liner material in two or more contact trenches formed in the insulator and depositing contact material over the liner material.

18. The method of claim 1, wherein the two or more contacts comprise Cu, Al, or W.

19. The method of claim 1, wherein a first one of the two or more contacts has a first height relative to the top surface of the pillar structure and a second one of the two or more contact has a second height different than the first height relative to the top surface of the substrate.

* * * * *